United States Patent

[11] 3,580,066

[72] Inventors William A. Pliskin
Poughkeepsie;
James E. Taylor, Wappingers Falls, N.Y.
[21] Appl. No. 834,884
[22] Filed June 19, 1969
[45] Patented May 25, 1971
[73] Assignee International Business Machines Corporation
Armonk, N.Y.

[54] METHOD FOR DETECTING EXPOSURE OF A BASE MATERIAL THROUGH AN OVERLYING COATING
6 Claims, No Drawings

[52] U.S. Cl. .......... 73/150, 73/104
[51] Int. Cl. .......... G01n 13/00
[50] Field of Search .......... 73/432, 150

[56] References Cited

UNITED STATES PATENTS

| | | | |
|---|---|---|---|
| 2,703,488 | 3/1955 | Gevantman et al. .......... | 73/150 |
| 3,266,306 | 8/1966 | Arnold et al. .......... | 73/150 |

*Primary Examiner*—S. Clement Swisher
*Attorneys*—Hanifin and Jancin and Robert W. Berray

ABSTRACT: The method for determining the completeness of etching of an oxide from a silicon semiconductor device discloses that bare silicon surfaces are hydrophobic while clean freshly etched oxide surfaces are hydrophilic. To determine whether the silicon is exposed, and therefore free of any oxide film subsequent to etching, the device is cooled and subjected to a stream of moist gas and observed under a microscope. If the etching process by which small holes are formed is incomplete, oxide will remain in the hole and therefore a film of condensed water will form in the holes indicating incomplete etching. If the etching process has been properly completed in the holes, bare silicon will remain causing the moisture to form in small droplets. The form of the moisture can be observed through the microscope.

METHOD FOR DETECTING EXPOSURE OF A BASE MATERIAL THROUGH AN OVERLYING COATING

BACKGROUND OF THE INVENTION

This invention relates to a method for determining the exposure of a base material through an overlying surface coating, and in particular to detecting completeness of etching of an oxide from a silicon device to form very small holes.

As the dimensions of integrated circuits become smaller, the processing more complex, and the device tolerances more critical, new processing techniques are required to achieve acceptable product yields. One specific problem encountered has been the high resistance in the metal-to-silicon electrical contacts of certain devices. The cause of the problem was found to be incompletely etched and/or reoxidized contact holes, that is, a layer of silicon oxide remaining on the silicon, preventing intimate contact of metal and silicon.

Existing technology made it difficult to insure that the etching process for generating very small holes to receive a metal contact was complete. Platinum contact metal does not penetrate thin layers of residual silicon oxide as does aluminum. Oxide layers of the orders of 0.1 microinch prevent the formation of well alloyed platinum-silicon contacts. Oxide layers of this thickness are invisible under the standard optical microscope. Overetching of the contact holes to a point insuring cleanliness caused the contacts to be oversized and caused emitter-base shorts. Prior to this invention the suitability of the etching, and thus an intimate contact, could not be insured until the device had been fabricated and tested.

SUMMARY OF THE INVENTION

The nature and gist of the present invention is that a clean, freshly etched silicon surface is hydrophobic, whereas an oxidized silicon surface is hydrophilic. When a moist gas is passed over the surface of the device being treated, after the device has been cooled, there will be condensation of discrete droplets of moisture in the area where a clean silicon surface is exposed. The condensation on a surface which still includes a thin film of oxide will be in the form of a uniform sheet of moisture. The only equipment required to practice the present invention is a microscope fitted with a stage for cooling the device and for passing a moist gas over the surface of the device.

Although the preferred embodiment relates to the selective removal of an overlying surface coating to expose a base material, the invention could also be used to detect an incomplete process of coating a base with a very thin surface coating. The only requirement in either case is that the base and overlying coating have different affinities for moisture.

It is the basic object of this invention to provide a method for detecting bare silicon in very small holes at the completion of an etching process which requires a minimum amount of apparatus and is easily observed by an untrained operator.

DESCRIPTION OF THE PREFERRED EMBODIMENT

This invention is based upon the discovery that the opposite affinities for moisture between silicon and silicon dioxide can be utilized during the process of etching holes for semiconductor devices to determine that very small contact holes are completely free of silicon dioxide. Silicon is hydrophobic, that is, lacks a strong affinity for moisture and silicon dioxide is hydrophilic, having a strong affinity for water.

During the production of a semiconductor device, the completeness of the etching process can be determined by drying the device, cooling it, and blowing a moist gas across the surface. If the etching process is complete, two different types of moisture condensation will form on the device. On that portion of the device which still retains silicon dioxide, the moisture will completely wet the surface and produce a thin film of moisture. That portion of the device which has been etched to the point where silicon is exposed will condense the moisture in such a way as to leave small beads of moisture on the surface. The differences between the two forms of condensation are easily determined when the device is viewed through a microscope.

An additional observation that can be made relates to insuring that the device is completely clean and not contaminated with the etching solution. The etching solution can be made to be hydrophobic such that when the moist gas condenses, the entire surface will show beads of moisture indicating the device is contaminated with the etching solution. An acceptable device, therefore, is one that shows the two forms of moisture condensation in desired areas. If etching is incomplete or etching solution remains on the device, the same form of condensation will be observed.

The only apparatus required to practice the present invention is a microscope fitted with a device-holding stage, preferably comprised of a thermoelectric cooling element for cooling the device to be examined below the dew point of the moist gas used in the examination. There must also be provided a means for blowing the vapor across the surface of the device being examined.

The gist of this invention is the fact that silicon dioxide and bare silicon have different affinities for moisture. Therefore, any vapor could be utilized for making the examination. However, in the production of semiconductor devices, it is important to insure that the device and contacts formed on the device are free of impurities and that the vapor utilized does not react with the silicon to produce an oxide coating. Therefore, the preferred vapor utilized in the present invention is formed by bubbling nitrogen through de-ionized or distilled water. As part of the same apparatus, it is desirable to also provide a source of dry nitrogen to be used for the purpose of drying the device under examination, both prior to the examination and subsequent thereto.

The entire process comprises the steps of cooling the device under examination on the microscope stage and drying the device with the source of dry nitrogen. When the device has been cooled to a temperature below the dew point of the nitrogen vapor, the wet nitrogen is passed over the surface of the device. Since bare silicon is hydrophobic, whereas an oxidized silicon surface or etching solution is hydrophilic, an acceptably device is observed when discrete water droplets are formed only in desired and clean silicon holes.

We claim:

1. A method of detecting the exposure of a base material, through an overlying surface coating of an object comprising the steps of:
   directing a stream of moist gas onto the surface of the object where the base and coating have differential affinities to moisture, the temperature of the gas and object being such as to cause condensation on the object; and
   detecting the form of moisture condensation on the object.

2. The method of claim 1 wherein said base is hydrophobic and said overlying coating is hydrophilic.

3. The method of claim 2 wherein the presence of the overlying coating is exhibited as a complete wetting of the surface with moisture and the exposed base is exhibited as beads of moisture.

4. The method of claim 3 wherein the base is silicon and the overlying coating is silicon dioxide.

5. The method of claim 4 wherein the moist gas is produced by directing nitrogen through de-ionized water.

6. The method of claim 1 preceded by the step of removing selected portions of the overlying coating to expose selected areas of the base using an etching solution having the same affinity for moisture as the base material, the method also being used to detect the presence of unremoved etching material wherein the selective exposure of the base is detected as unacceptable when the entire surface of the object exhibits the same form of condensed moisture.